(12) United States Patent
Kim et al.

(10) Patent No.: US 12,288,674 B2
(45) Date of Patent: Apr. 29, 2025

(54) HYBRID MATCHER AND RADIO FREQUENCY MATCHING SYSTEM INCLUDING THE HYBRID MATCHER

(71) Applicant: SAMSUNG ELECTRONICS CO., LTD., Suwon-si (KR)

(72) Inventors: Hyosin Kim, Suncheon-si (KR); Sungyong Lim, Seoul (KR); Minsung Kim, Seoul (KR); Dongyub Kim, Suwon-si (KR); Sungyeol Kim, Yongin-si (KR); Jongbeom Moon, Hwaseong-si (KR); Seungbo Shim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 428 days.

(21) Appl. No.: 17/859,316

(22) Filed: Jul. 7, 2022

(65) Prior Publication Data
US 2023/0187175 A1 Jun. 15, 2023

(30) Foreign Application Priority Data
Dec. 9, 2021 (KR) .................. 10-2021-0176115

(51) Int. Cl.
*H01J 37/32* (2006.01)
*H03H 7/38* (2006.01)

(52) U.S. Cl.
CPC ......... *H01J 37/32183* (2013.01); *H03H 7/38* (2013.01); *H01J 2237/24564* (2013.01)

(58) Field of Classification Search
CPC ...... H01J 37/32183; H01J 2237/24564; H03H 7/38
See application file for complete search history.

(56) References Cited

U.S. PATENT DOCUMENTS

| | | | |
|---|---|---|---|
| 8,436,643 B2 | 5/2013 | Mason | |
| 10,229,816 B2 | 3/2019 | Coumou et al. | |
| 10,984,986 B2 | 4/2021 | Ulrich | |
| 2020/0144032 A1* | 5/2020 | Ulrich | H01L 21/67069 |
| 2020/0168439 A1 | 5/2020 | Bhutta et al. | |
| 2021/0013009 A1* | 1/2021 | Oliveti | H01J 37/32926 |
| 2021/0210311 A1 | 7/2021 | Mavretic et al. | |
| 2021/0305018 A1* | 9/2021 | Bhutta | H03H 7/40 |

* cited by examiner

*Primary Examiner* — Alexander H Taningco
*Assistant Examiner* — Pedro C Fernandez
(74) *Attorney, Agent, or Firm* — Muir Patent Law, PLLC

(57) ABSTRACT

Provided are a hybrid matcher capable of precisely performing impedance matching at a high speed when RF power is applied with a multi-level pulse in a facility using RF plasma, and an RF matching system including the hybrid matcher. The hybrid matcher includes a matching circuit in which a plurality of variable element-switch sets are connected to each other in parallel, the variable element-switch sets each including a variable impedance element and a switch connected to the variable impedance element in series and electrically operating therewith, a sensor disposed at a front stage of the matching circuit and configured to measure a current and a voltage of radio frequency (RF) power applied from an RF generator, a variable element driver configured to drive the variable impedance element, a switch driver configured to drive the switch, and a controller configured to control the variable element driver and the switch driver.

20 Claims, 14 Drawing Sheets

HYBRID MATCHER AND RADIO FREQUENCY MATCHING SYSTEM INCLUDING THE HYBRID MATCHER

CROSS-REFERENCE TO RELATED APPLICATION

This application is based on and claims priority under 35 U.S.C. § 119 to Korean Patent Application No. 10-2021-0176115, filed on Dec. 9, 2021, in the Korean Intellectual Property Office, the disclosure of which is incorporated by reference herein in its entirety.

BACKGROUND

1. Field

Embodiments relate to a hybrid matcher and a radio frequency matching system including the hybrid matcher.

2. Description of the Related Art

In general, in order to manufacture a semiconductor device, a series of processes, such as deposition, etching, and cleaning, may be performed. These processes may be performed by a deposition, etching, or cleaning device having a process chamber.

SUMMARY

An embodiment is directed to a hybrid matcher including a matching circuit in which a plurality of variable element-switch sets are connected to each other in parallel, the variable element-switch sets each including a variable impedance element and a switch connected to the variable impedance element in series and electrically operating therewith, a sensor disposed at a front stage of the matching circuit and configured to measure a current and a voltage of radio frequency (RF) power applied from an RF generator, a variable element driver configured to drive the variable impedance element, a switch driver configured to drive the switch, and a controller configured to control the variable element driver and the switch driver.

An embodiment is directed to a hybrid matcher including a matching circuit in which plurality of vacuum variable capacitor (VVC)-switch sets are connected in parallel, the VVC-switch sets each including a VVC and a switch connected to the VVC in series and electrically operating therewith, a sensor disposed at a front stage of the matching circuit and configured to measure a current and a voltage of radio frequency (RF) power applied from an RF generator, a motor configured to drive the VVC, a switch driver configured to drive the switch, and a controller configured to control the motor and the switch driver, wherein, in a facility using RF plasma, the hybrid matcher is disposed between the RF generator and a load and performs impedance matching when the RF generator applies the RF power as a multi-level pulse to the load.

An embodiment is directed to a radio frequency (RF) matching system including a load, an RF generator configured to generate RF power with a multi-level pulse and supply the generated RF power to the load, and a hybrid matcher disposed between the RF generator and the load and performing impedance matching, wherein the hybrid matcher includes a matching circuit in which plurality of vacuum variable capacitor (VVC)-switch sets each including a VVC and a switch connected to the VVC in series and electrically operating are connected in parallel, a sensor disposed at a front stage of the matching circuit and configured to measure a current and a voltage of radio frequency (RF) power applied from an RF generator, a motor configured to drive the VVC, a switch driver configured to drive the switch, and a controller configured to control the motor and the switch driver.

BRIEF DESCRIPTION OF THE DRAWINGS

Features will become apparent to those of skill in the art by describing in detail example embodiments with reference to the attached drawings in which.

DETAILED DESCRIPTION

Figure 1:
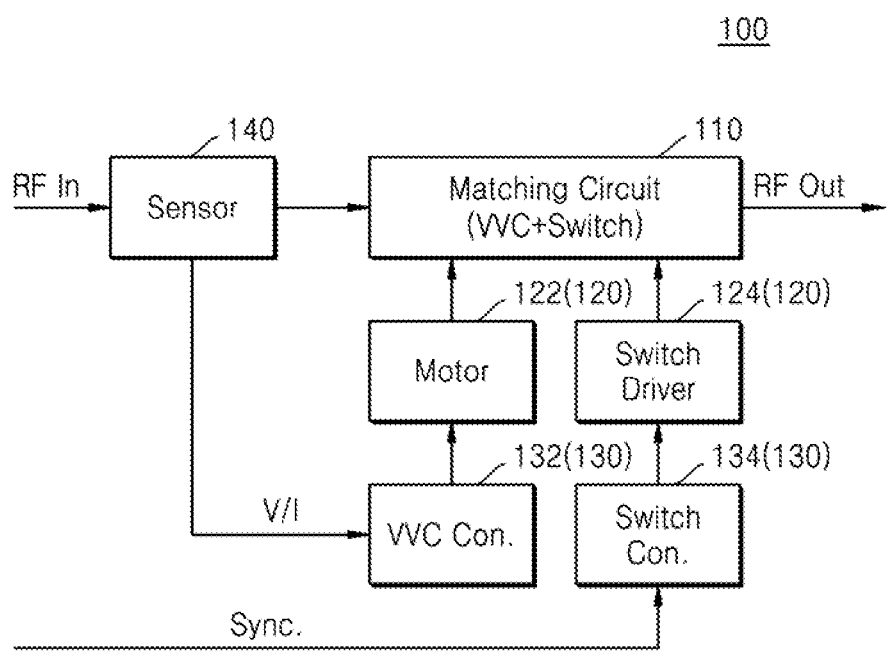
FIG. 1 is a block diagram of a hybrid matcher according to an example embodiment.

Hereinafter, embodiments of the inventive concept are described in detail with reference to the accompanying drawings. The same reference numerals are used for the same components in the drawings, and duplicate descriptions thereof are omitted.

FIG. 1 is a block diagram of a hybrid matcher 100 according to an example embodiment.

Referring to FIG. 1, the hybrid matcher 100 according to the present example embodiment may include a matching circuit 110, a matching circuit driver 120, a controller 130, and a sensor 140. When a radio frequency (RF) generator (200 of FIG. 8) applies RF power as a multi-level pulse to a load (300 of FIG. 8), the hybrid matcher 100 of the present example embodiment may perform impedance matching. For example, the hybrid matcher 100 of the present example embodiment may perform impedance matching when RF power is applied to a facility using RF plasma, e.g., a plasma chamber.

For reference, in general, a matcher may adjust impedance so that RF power from the RF generator 200 may be transmitted to the load 300, such as a plasma chamber, to the maximum. For example, the matcher may maximize transmission of RF power by adjusting impedance so that a complex conjugate condition is satisfied based on a maximum power delivery theory. Thus, for example, the matcher may allow the RF generator 200 to be driven in an environment of 50Ω to minimize reflected power, so that the RF power from the RF generator 200 is transferred to the load 300 to the maximum.

The hybrid matcher 100 of the present example embodiment adjusts impedance so that RF power from the RF generator 200 may be transferred to the load 300, such as the plasma chamber, to the maximum. In addition, when RF power is transferred in the form of a multi-level pulse, the hybrid matcher 100 of the present example embodiment may precisely adjust impedance by using the matching circuit 110 so that RF power may be transmitted to the load 300 to the maximum. The multi-level pulse is described in detail with reference to FIGS. 2A to 2D.

The matching circuit 110 may have a structure in which a plurality of variable element-switch sets (refer to 115 of FIG. 6) are connected in parallel. Each of the variable element-switch sets 115 may include a variable element, e.g., a variable impedance element, (see 112 in FIG. 4A) and a switch (see 114 in FIG. 4A) connected in series with the variable impedance element, e.g., the variable element 112. In the hybrid matcher 100 of the present example embodiment, the variable element 112 of the variable element-switch set 115 may include, e.g., a vacuum variable capacitor (VVC). The VVC is a mechanical variable element that varies capacitance by adjusting an interval between electrodes with a machine, such as a motor, and a matching time may take as long as 1 second (1 s) or more. Meanwhile, impedance matching may be performed by the use of an electrical variable capacitor (EVC), frequency control, or only the use of VVC, as described in detail with reference to FIG. 7.

In the matching circuit 110, the variable element-switch sets 115 may be connected in parallel by as many as the number of states of the multi-level pulse, and one variable element-switch set per state may be assigned 1:1. In addition, the matching circuit 110 may include a first matching circuit (refer to 110-1 in FIG. 4A and the like) on an input side and a second matching circuit (refer to 110-2 in FIG. 4A and the like) on an output side, and may have various circuit structures according to a connection form between the first matching circuit 110-1 and the second matching circuit 110-2. The circuit structure of the matching circuit 110 is described in more detail with reference to FIGS. 4A to 4C.

The matching circuit driver 120 may drive the matching circuit 110. In an example embodiment, the matching circuit driver 120 may include a variable element driver (or a motor) 122 and a switch driver 124. The variable element driver 122 may drive the variable element 112, and the switch driver 124 may drive the switch 114. Thus, the variable element driver 122 may vary impedance by driving the variable element 112, and the switch driver 124 may drive the switch 114 to turn the switch 114 on or off. For example, in the hybrid matcher 100 of the present example embodiment, as shown in FIG. 1, the variable element 112 may be a VVC, and the variable element driver 122 may be a motor that mechanically drives the VVC. The motor may change the capacitance of the VVC by adjusting an interval between electrodes of the VVC.

The controller 130 may control the matching circuit driver 120. The controller 130 may include a variable element controller 132 and a switch controller 134. The variable element controller 132 may control the variable element driver 122, and the switch controller 134 may control the switch driver 124. In the hybrid matcher 100 of the present example embodiment, the variable element 112 and the variable element driver 122 may be a VVC and a motor, respectively, and the variable element controller 132 may be a VVC controller. As indicated by the arrows in FIG. 1, the variable element controller 132 may control the variable element driver 122, upon receiving a signal for RF power information from the sensor 140. Here, the signal for RF power information may be a signal (V/I) for current and voltage information. Also, the switch controller 134 may control the switch driver 124, upon receiving a synchronization signal Sync. from the RF generator 200.

The sensor 140 may measure the current and voltage of the RF power from the RF generator 200. For example, the sensor 140 may measure the current and voltage of the RF power in each of corresponding states by measuring reflected RF power in each of the states to which the RF power is applied in the form of a multi-level pulse. Based on the reflected RF power of the corresponding state measured by the sensor 140, the variable element controller 132 may minimize the reflected RF power by adjusting the variable element 112, e.g., the VVC, by controlling the variable element driver 122, e.g., the motor, thereby performing impedance matching of the corresponding state. For reference, in FIG. 1, RF power may be input (RF In) from the RF generator 200 to the hybrid matcher 100, and may be output (RF Out) to the load 300, such as a plasma chamber, through the hybrid matcher 100. Also, the synchronization signal Sync. may be input from the RF generator 200 to the hybrid matcher 100.

In FIG. 1, in the hybrid matcher 100 of the present example embodiment, a single sensor 140 is disposed, but according to example embodiments, a plurality of sensors may be disposed at various locations. For example, a sensor may be disposed at an output end of the RF generator 200 and an input end and an output end of the hybrid matcher 100. In an example embodiment, a sensor disposed at the output terminal of the RF generator 200 may measure RF power and reflected RF power. In addition, a sensor disposed at the output terminal of the hybrid matcher 100 may measure RF power transmitted to the load 300. Meanwhile, a sensor disposed at the input terminal of the hybrid matcher 100 may measure RF power reflected from the load 300, i.e., reflected RF power.

The hybrid matcher 100 of the present example embodiment may include the matching circuit 110, in which a plurality of variable element-switch sets 115 are connected in parallel, and each of the variable element-switch sets 115 may include a variable impedance element, such as a VVC, and an electrically connected switch connected to the variable impedance element. The variable element-switch sets 115 may be connected in parallel by as many as the number of states of RF power applied in the form of a multi-level pulse. Accordingly, the hybrid matcher 100 of the present example embodiment may include the structure of the matching circuit 110, and may precisely perform impedance matching at a high speed in response to each of the states of RF power applied in the form of a multi-level pulse. For example, the hybrid matcher 100 of the present example embodiment may perform impedance matching with a matching speed of 1 ms or less and a high matching resolution of 0.1 pF or less. Here, the matching resolution refers to a minimum variation in capacitance for impedance matching, and as the minimum variation decreases, the matching resolution increases and impedance matching may be precisely performed.

Meanwhile, as described above, in the case of a VVC, a matching speed may be slow, which may mean considering the entire range of RF power. However, in the case of the hybrid matcher 100 of the present example embodiment, each of the variable element-switch sets 115 may have a small matching range corresponding to RF power of a corresponding state. Accordingly, in each of the variable element-switch sets 115, the VVC may linearly, quickly, and precisely match impedance within the matching range. In addition, the variable element-switch sets 115 may move between different matching ranges through the electrically operated switch, that is, the switch 114, thereby performing impedance matching over the entire range of RF power at a high speed.

The hybrid matcher 100 of the present example embodiment may perform impedance matching easily in response to RF power of high frequency and high power. For example, the hybrid matcher 100 of the present example embodiment may easily perform impedance matching in response to RF power having a high frequency of 40 MHz or higher and high power of 3 kW or greater.

FIGS. 2A to 2D are graphs and conceptual diagrams illustrating a concept of RF power of a multi-level pulse in a semiconductor process using RF plasma.

Figure 2A:
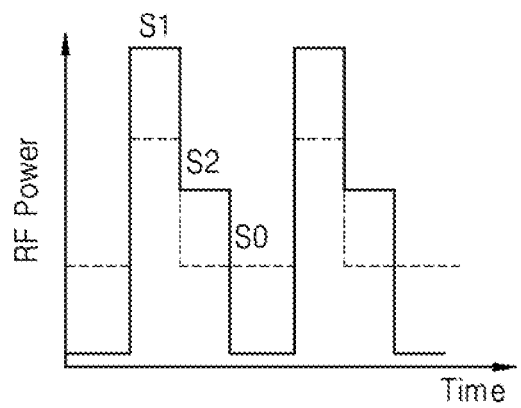
FIGS. 2A to 2D are graphs and conceptual diagrams illustrating a concept of radio frequency (RF) power of a multi-level pulse in a semiconductor process using RF plasma.

Referring to FIG. 2A, the graph shows RF power of a multi-level pulse having two types of RF frequencies. Thus, first RF power of the solid line may have a form of a multi-level pulse having a first RF frequency. In addition, second RF power of the dashed line may have a form of a multi-level pulse having a second RF frequency. Here, the form of the multi-level pulse may refer to a form in which RF power is periodically repeated with three or more levels. For example, because the first RF power is periodically repeated with a highest level, a middle level, and a lowest level, the first RF power may be considered to have a form of a multi-level pulse. Meanwhile, when the lowest level is 0, the form of the multi-level pulse may be determined with two or more levels excluding the lowest level.

In the graph of FIG. 2A, when the sum of the first RF power and the second RF power is referred to as total RF power, the total RF power may also have a form of a multi-level pulse. In an example embodiment, states of the total RF power may be distinguished by the sum of the first RF power and the second RF power for each section. For example, in the graph of FIG. 2A, states of the total RF power may be divided into three types. Thus, a first state S1 may refer to a state in which the highest level of the first RF power is combined with the highest level of the second RF power. Also, a second state S2 may refer to a state in which the middle level of the first RF power is combined with the lowest level of the second RF power. Finally, a third state S0 may refer to a state in which the lowest level of the first RF power is combined with the lowest level of the second RF power. Meanwhile, as can be seen from the graph of FIG. 2A, the lowest level of the second RF power may be greater than the lowest level of the first RF power. Meanwhile, the lowest level of the first RF power may be zero or greater than zero. As described above, because the total RF power is periodically repeated with three states, the total RF power may be considered to have a form of a multi-level pulse.

Figure 2B:
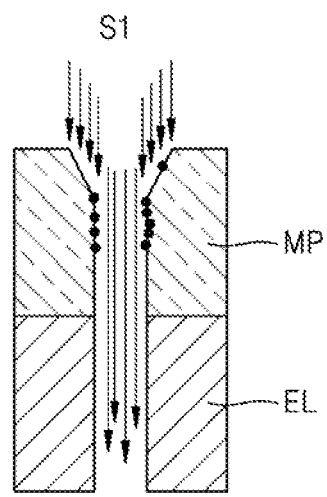
Figure 2C:
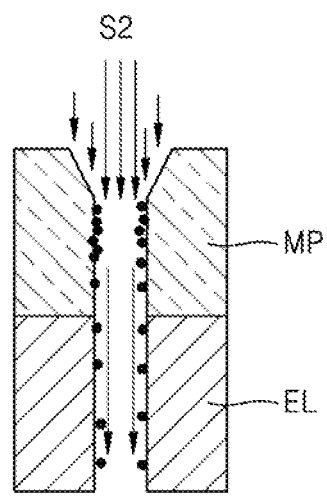
Figure 2D:
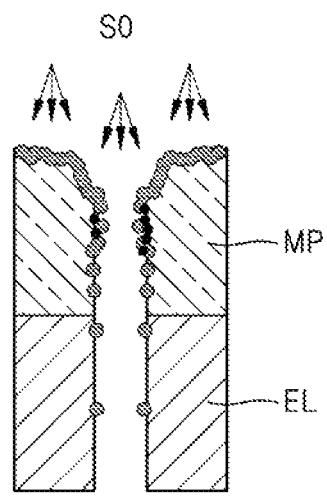

Referring to FIGS. 2B to 2D, in a semiconductor process using RF plasma, e.g., an etching and/or cleaning process, an etching target may be precisely etched without contamination by applying RF power in a form of a multi-level pulse as shown in the graph of FIG. 2A. For example, as shown in FIG. 2B, the RF power in the first state S1 having high power may be used to vertically etch an etch target layer EL. In FIG. 2B, a layer on the etch target layer EL may be a mask pattern MP. During the etching process, byproducts indicated as small black particles may be accumulated at an inlet of the mask pattern MP.

Referring to FIG. 2C, if the byproducts at the inlet side of the mask pattern MP are not removed in the etching process, the inlet of the mask pattern MP may be blocked and a smooth etching process may not be performed. Therefore, a cleaning process or a byproduct removal process may be performed, and the RF power of the second state S2 having intermediate power may be used in the cleaning process or the byproduct removal process.

Referring to FIG. 2D, during a vertical etching process based on the RF power of the first state S1 or the byproduct removal process based on the RF power of the second state S2, the inlet of the mask pattern MP may be damaged. Accordingly, a process of depositing a protective material layer for protecting the inlet of the mask pattern MP may be performed. The RF power of the third state S0 having the lowest power may be used in the process of depositing the protective material layer. In FIG. 2D, a gray layer or gray grains may correspond to the protective material layer. As a result, the etch target layer EL may be precisely etched without contamination by applying the RF power in the form of a multi-level pulse during the etching and/or cleaning process using the RF plasma.

Figure 3:
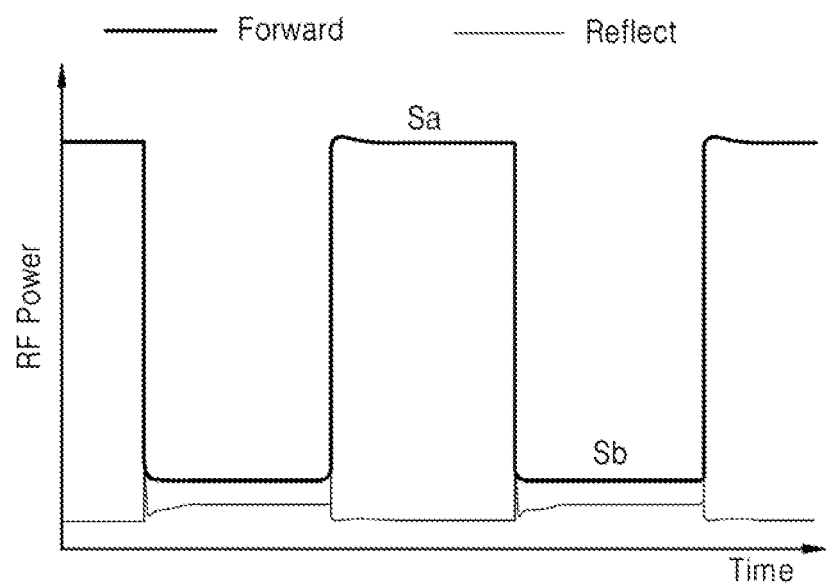
FIG. 3 is a graph illustrating a concept of impedance matching with respect to RF power.

FIG. 3 is a graph illustrating a concept of impedance matching with respect to RF power.

Referring to FIG. 3, in the graph, a thick straight line Forward refers to RF power applied from the RF generator 200, and a thin straight line Reflect may refer to reflected RF power reflected from the load 300. In the graph, RF power has one frequency and is applied in two level states Sa and Sb, and the RF power of the low level state Sb may be greater than 0. In addition, impedance matching is performed only for the high level state Sa. Accordingly, it can be seen from the graph that the reflected RF power corresponding to the RF power in the high level state Sa is lower than the reflected RF power corresponding to the RF power in the low level state Sb. If impedance matching is not performed, the reflected RF power corresponding to the RF power in the high level state Sa may be significantly greater than the reflected RF power corresponding to the RF power in the low level state Sb.

Figure 4A:
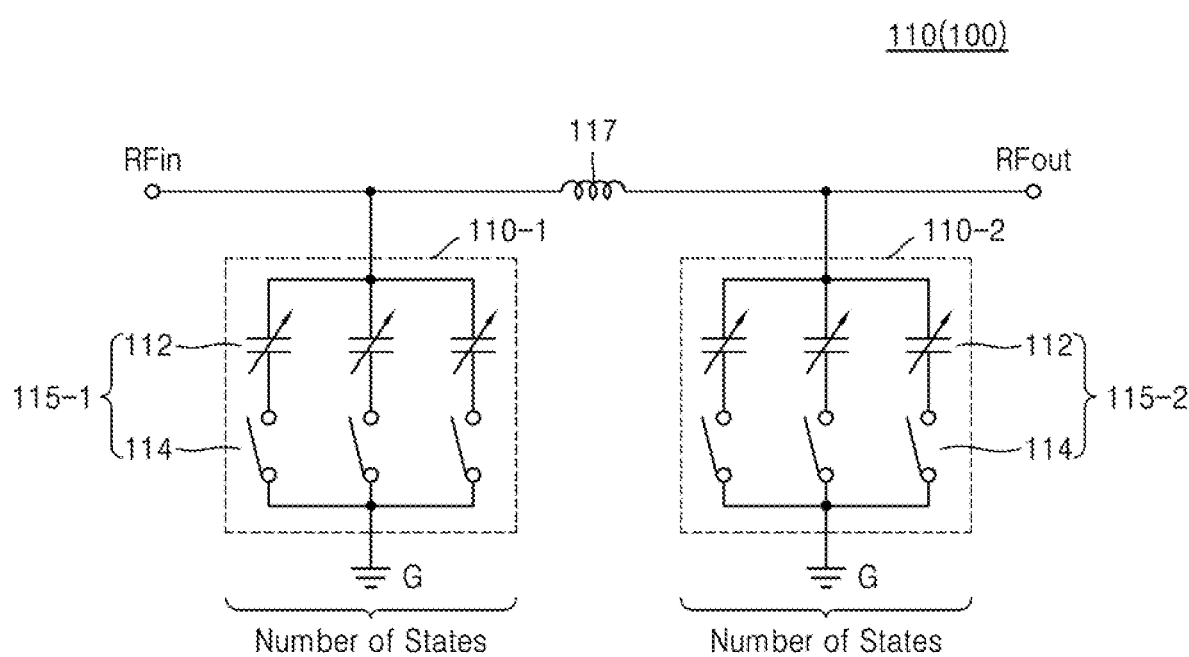
FIGS. 4A to 4C are circuit diagrams illustrating various types of matching circuits in the hybrid matcher of FIG. 1.
Figure 4B:
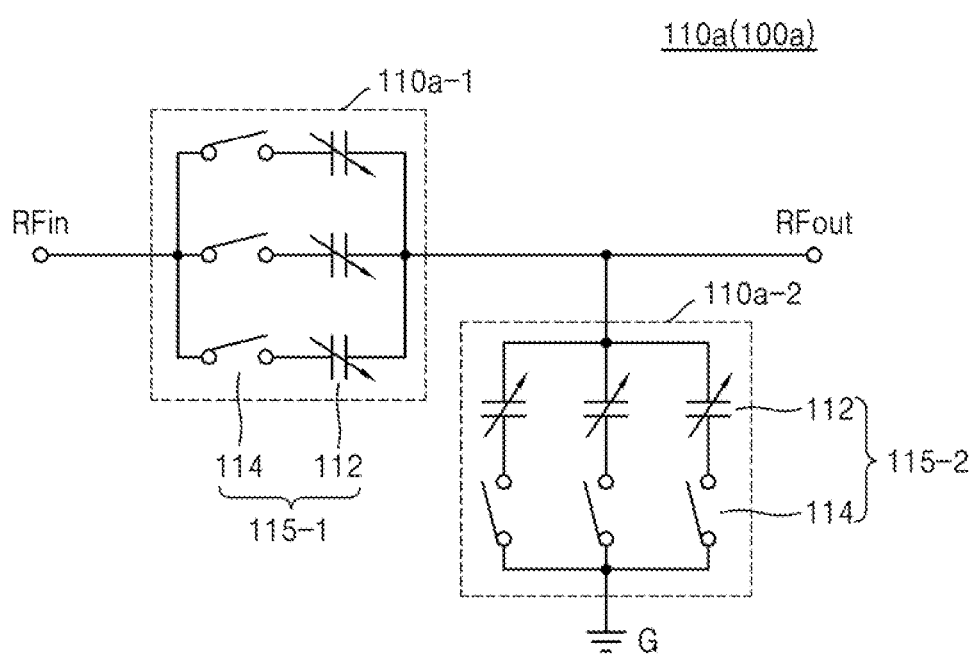
Figure 4C:
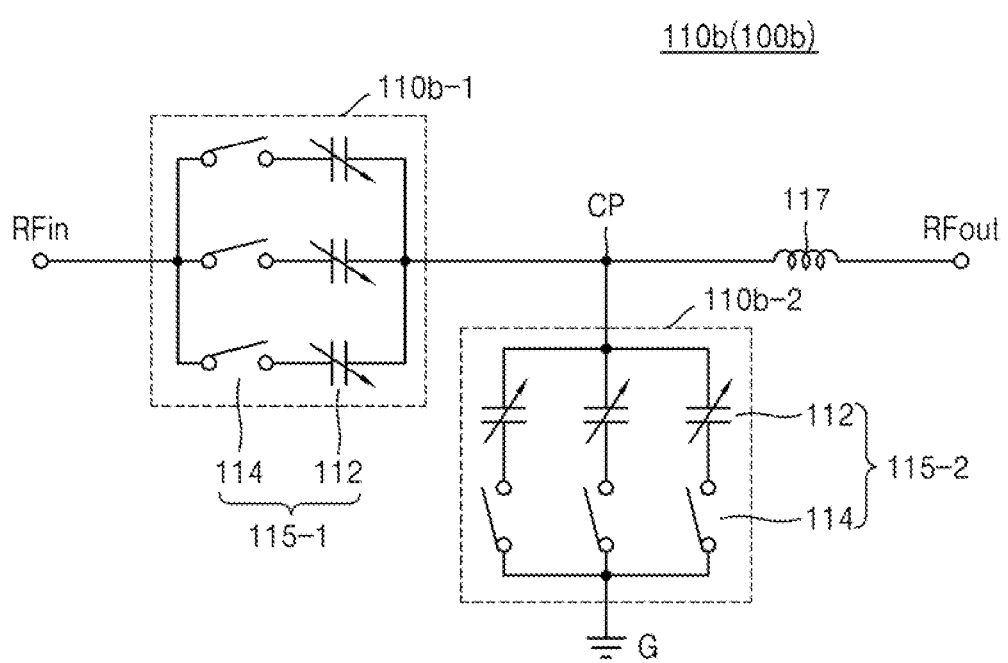

FIGS. 4A to 4C are circuit diagrams illustrating various types of matching circuits that may be implemented in the hybrid matcher of FIG. 1. The descriptions already given with reference to FIGS. 1 to 3 are briefly given or omitted.

Referring to FIG. 4A, in the hybrid matcher 100 of the present example embodiment, the matching circuit 110 may include a first matching circuit 110-1 and a second matching circuit 110-2. Also, the matching circuit 110 may have a Π-shaped structure. In an example embodiment, the matching circuit 110 may include an input terminal RFin at the RF generator 200 side, an output terminal RFout at the load 300 side, and a ground terminal G disposed between the input terminal RFin and the output terminal RFout. The first matching circuit 110-1 may be disposed between the input terminal RFin and the ground terminal G, and the second matching circuit 110-2 may be disposed between the output terminal RFout and the ground terminals G. An inductor 117 may be disposed between the input terminal RFin and the output terminal RFout. The first matching circuit 110-1, the second matching circuit 110-2, and the inductor 117 may be disposed with the Π-shaped structure between the input terminal RFin and the output terminal RFout, and accordingly, the matching circuit 110 may have the Π-shaped structure. According to another example embodiment, the inductor 117 may be replaced with a fixed capacitor or may be replaced with a series-parallel structure of an inductor and a capacitor.

The first matching circuit 110-1 and the second matching circuit 110-2 may include the same number of variable element-switch sets 115-1 and 115-2. The variable element-switch sets 115-1 and 115-2 may each include the variable element 112 and the switch 114 connected in series therewith. The variable element-switch sets 115-1 and 115-2 may be connected to each other in parallel. In an example embodiment, referring to FIG. 4A, the first matching circuit 110-1 may include three variable element-switch sets 115-1 connected to each other in parallel, and the second matching circuit 110-2 may include three variable element-switch sets 115-2 connected to each other in parallel.

The number of variable element-switch sets 115-1 of the first matching circuit 110-1 and the number of variable element-switch sets 115-2 of the second matching circuit 110-2 may be varied, e.g., as described above, the number of variable element-switch sets may be the same as the number of states of the multi-level pulse, and the variable element-switch sets and the states of the multi-level pulse may have a 1:1 correspondence. According to an example embodiment, each of the first matching circuit 110-1 and the second matching circuit 110-2 may include two or more variable element-switch sets 115-1 and 115-2 connected to each other in parallel.

Referring to FIG. 4B, in a hybrid matcher 100a according to an example embodiment, a matching circuit 110a may include a first matching circuit 110a-1 and a second matching circuit 110a-2. The matching circuit 110a may have an L-shaped structure. In an example embodiment, the matching circuit 110a may include an input terminal RFin at the RF generator 200 side, an output terminal RFout at the load 300 side, and a ground terminal G disposed between the input terminal RFin and the output terminal RFout. Referring to FIG. 4B, the first matching circuit 110a-1 may be disposed between the input terminal RFin and the output terminal RFout, and the second matching circuit 110a-2 may be disposed between the output terminal RFout and the ground terminal G. The first matching circuit 110a-1 and the second matching circuit 110a-2 may be disposed with the L-shaped structure between the input terminal RFin and the output terminal RFout. And accordingly, the matching circuit 110a may have the L-shaped structure. According to another example embodiment, the second matching circuit 110a-2 may be disposed between the input terminal RFin and the ground terminal G.

The first matching circuit 110a-1 and the second matching circuit 110a-2 may include the same number of variable element-switch sets 115-1 and 115-2. The variable element-switch sets 115-1 and 115-2 may each include a variable element 112 and a switch 114 connected in series therewith. The variable element-switch sets 115-1 and 115-2 may be connected to each other in parallel. The number of variable element-switch sets 115-1 of the first matching circuit 110a-1 and the number of variable element-switch sets 115-2 of the second matching circuit 110a-2 may be varied, e.g., as described above, the number of variable element-switch sets may be the same as the number of states of the multi-level pulse, and the variable element-switch sets and the states of the multi-level pulse may have a 1:1 correspondence. According to an embodiment, each of the first matching circuit 110a-1 and the second matching circuit 110a-2 may include two or more variable element-switch sets 115-1 and 115-2 connected in parallel to each other.

Referring to FIG. 4C, in a hybrid matcher 100b according to an example embodiment, a matching circuit 110b may include a first matching circuit 110b-1 and a second matching circuit 110b-2. The matching circuit 110b may have a T-shaped structure. In an example embodiment, the matching circuit 110b may include an input terminal RFin at the RF generator 200 side, an output terminal RFout at the load 300 side, and a ground terminal G disposed between the input terminal RFin and the output terminal RFout. Referring to FIG. 4C, the first matching circuit 110b-1 may be disposed between the input terminal RFin and a connection point CP, and the second matching circuit 110b-2 may be disposed between the connection point CP and the ground terminal G. An inductor 117 may be disposed between the connection point CP and the output terminal RFout. Referring to FIG. 4C, the first matching circuit 110b-1, the second matching circuit 110b-2, and the inductor 117 may be disposed with the T-shaped structure between the input terminal RFin and the output terminal RFout. Accordingly, the matching circuit 110b may have the T-shaped structure. According to another example embodiment, the inductor 117 may be replaced with a fixed capacitor, or may be replaced with a series-parallel structure of an inductor and a fixed capacitor. According to another example embodiment, the first matching circuit 110b-1 may be disposed between the output terminal RFout and the connection point CP, and the inductor 117 may be disposed between the input terminal RFin and the connection point CP.

The first matching circuit 110b-1 and the second matching circuit 110b-2 may include the same number of variable element-switch sets 115-1 and 115-2. The variable element-switch sets 115-1 and 115-2 may each include a variable element 112 and a switch 114 connected in series therewith. The variable element-switch sets 115-1 and 115-2 may be connected to each other in parallel. The number of variable element-switch sets 115-1 of the first matching circuit 110b-1 and the number of variable element-switch sets 115-2 of the second matching circuit 110b-2 may be varied, e.g., as described above, the number of variable element-switch sets may be the same as the number of states of the multi-level pulse, and the variable element-switch sets and the states of the multi-level pulse may have a 1:1 correspondence. According to an embodiment, each of the first matching circuit 110b-1 and the second matching circuit 110b-2 may include two or more variable element-switch sets 115-1 and 115-2 connected to each other in parallel.

Figure 5A:
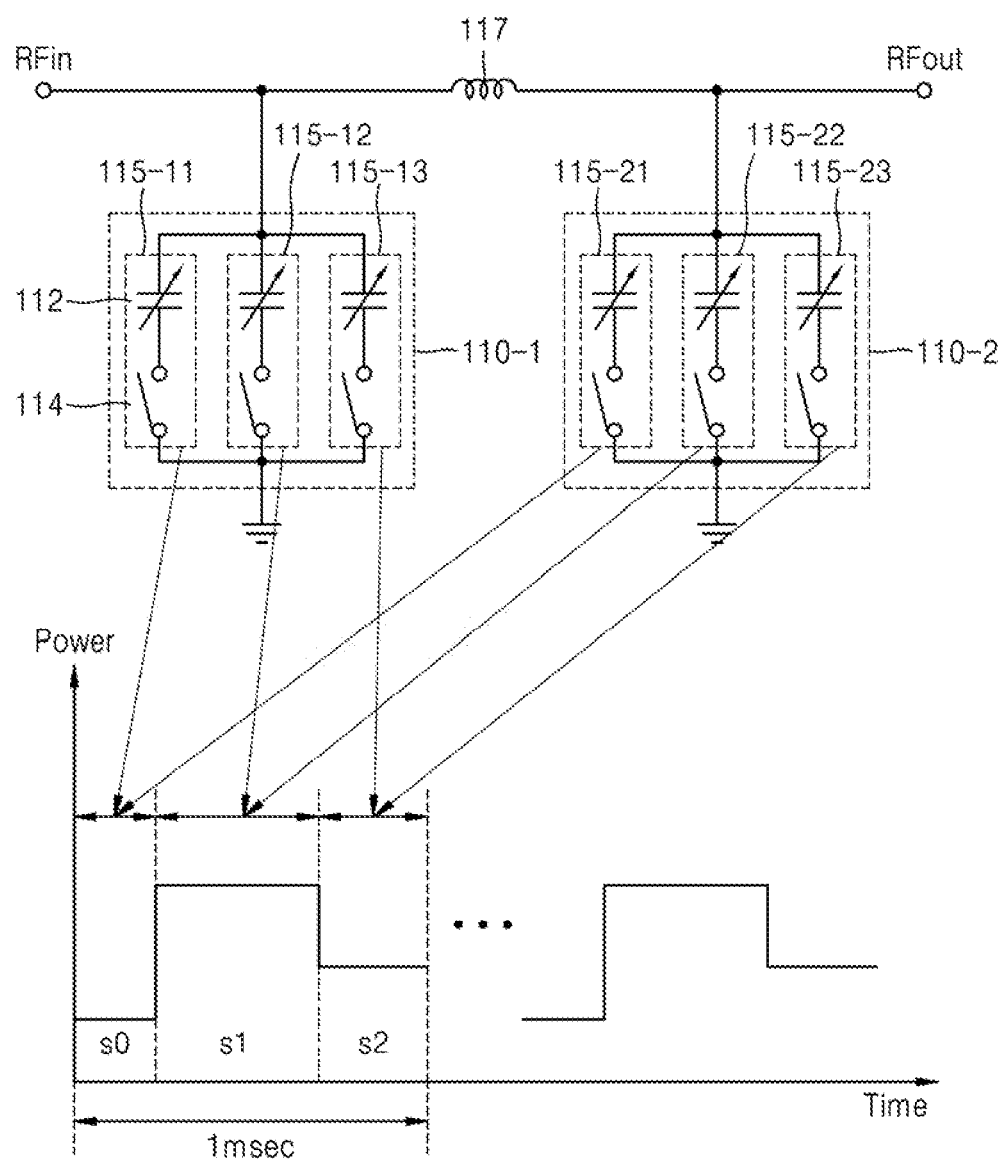
FIGS. 5A and 5B are, respectively, a conceptual diagram illustrating a process of performing matching in response to RF power of a multi-level pulse in the hybrid matcher of FIG. 1, and a Smith chart illustrating a shift of states in the matching process.
Figure 5B:
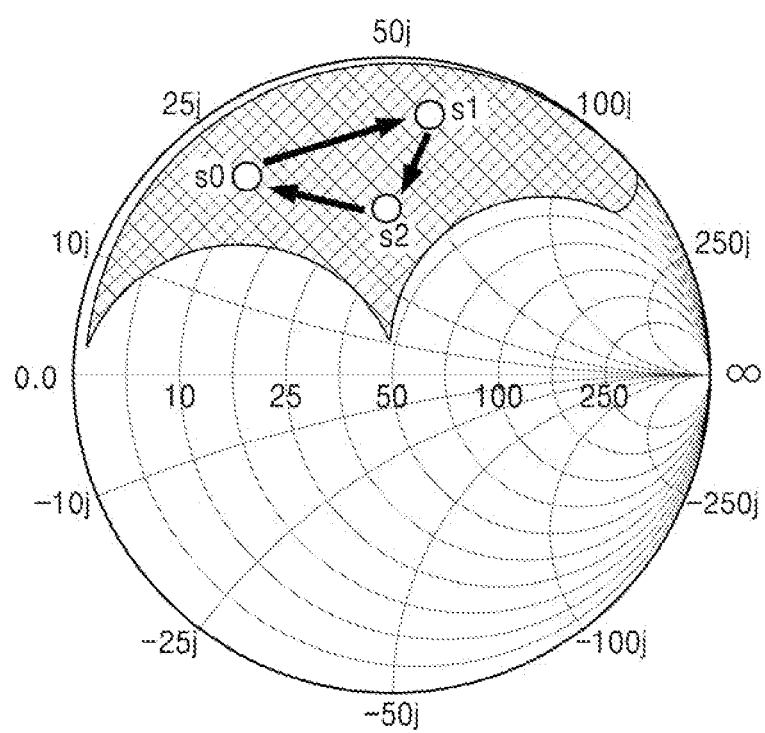

FIGS. 5A and 5B are, respectively, a conceptual diagram illustrating a process of performing matching in response to RF power of a multi-level pulse in the hybrid matcher of FIG. 1, and a Smith chart illustrating a shift of states in the matching process. The descriptions already given with reference to FIGS. 1 to 4C are briefly given or omitted.

Referring to FIG. 5A, referring to the graph at the bottom, RF power may be applied to the load 300 in the form of a multi-level pulse having one RF frequency. For example, RF power may be repeatedly applied with the third state s0 having a lowest level, the first state s1 having a highest level, and the second state s2 having an intermediate level. In an example embodiment, a section corresponding to 1 msec on the x-axis may correspond to one pulse, and this pulse may be repeated with a period of 1 msec.

In the hybrid matcher 100 of the present example embodiment, there are three states of RF power and the matching circuit 110 includes three variable element-switch sets 115 connected in parallel, with the matching circuit 110 including a first matching circuit 110-1 on the input side and the second matching circuit 110-2 on the output side, and the first matching circuit 110-1 and the second matching circuit 110-2 each including three variable element-switch sets 115 connected in parallel. The first matching circuit 110-1 may include a first variable element-switch set 115-11, a second variable element-switch set 115-12, and a third variable element-switch set 115-13 connected in parallel to each other. In addition, the second matching circuit 110-2 may include a first variable element-switch set 115-21, a second variable element-switch set 115-22, and a third variable element-switch set 115-23 connected in parallel to each other.

As indicated by the arrows, in response to the third state s0, the first variable element-switch set 115-11 of the first matching circuit 110-1 and the first variable element-switch set 115-21 of the second matching circuit 110-2 may perform impedance matching. Also, in response to the first state s1, the second variable element-switch set 115-11 of the first matching circuit 110-1 and the second variable element-switch set 115-22 of the second matching circuit 110-2 may perform impedance matching. Also, in response to the second state s2, the third variable element-switch set 115-13 of the first matching circuit 110-1 and the second variable element-switch set 115-23 of the second matching circuit 110-2 may perform impedance matching.

Meanwhile, in each of the first matching circuit 110-1 and the second matching circuit 110-2, shifting between the states s0, s1, and s2 may be performed through the switch 114. For example, when shifting from the third state s0 to the first state s1, the switch 114 of the first variable element-switch set 115-11 of the first matching circuit 110-1 and the first variable element-switch set 115-21 of the second matching circuit 110-2 may be turned off, and the switch 114 of the second variable element-switch set 115-12 of the first matching circuit 110-1 and the second variable element-switch set 115-22 of the second matching circuit 110-2 may be turned on. Because the switching operation is performed electrically, shifting between states may be performed at a high speed. In addition, by mechanically varying the variable element 112, e.g., the VVC, through the variable element driver 122 such as a motor in one state, impedance matching may be precisely performed.

In the hybrid matcher 100 of the present example embodiment, the matching circuit 110 may have a Π-shaped structure for each of the states s0, s1, and s2, and may perform impedance matching. For example, with respect to the third state s0, the first variable element-switch set 115-11 of the first matching circuit 110-1, the first variable element-switch set 115-21 of the second matching circuit 110-2 corresponding thereto, and the inductor 117 may have a Π-shaped structure and perform impedance matching. Meanwhile, when impedance matching is performed on any one state, the capacitance of a variable element, e.g., the VVC, of any one variable element-switch set 115 of the first matching circuit 110-1 and capacitance of a variable element, e.g., the VVC, of any one variable element-switch set 115 of the second matching circuit 110-2 corresponding thereto may be different from each other.

Referring to FIG. 5B, shifting between states s0, s1, and s2 in the Smith chart is illustrated. Shifting between the states s0, s1, and s2 is performed through a switching operation by the electrically operated switch, that is, the switch 114, and thus, the shifting may be performed at a high speed. For reference, in the Smith chart, the central horizontal line is a line having a phase of 0° or 180° in which there is no reactance component in impedance and only a resistance component may exist. In addition, when shifting from a portion 0.0 in a clockwise or counterclockwise direction, an absolute value of the phase may increase. For example, an upper portion of the horizontal line may correspond to an inductance component of a reactance component, and a lower portion of the horizontal line may correspond to a capacitance component of the reactance component. In the Smith chart, shifting in a horizontal line direction may mainly correspond to a change in the reactance component, and shifting in a vertical line direction may mainly correspond to a change in a resistance component.

The hatched portion in the Smith chart of FIG. 5B may correspond to an impedance variable region. Impedance of each of the states s0, s1, and s2 may be located in the impedance variable region, and high-speed shifting may be performed between the impedances of the states s0, s1, and s2 through a switching operation. Meanwhile, the impedance itself of each of the states s0, s1, and s2 may be finely adjusted through the variable element 112, e.g., the VVC. Although not shown in the Smith chart of FIG. 5B, fine impedance adjustment in one state may appear as slight shifting in a point corresponding to a corresponding state.

Figure 6:
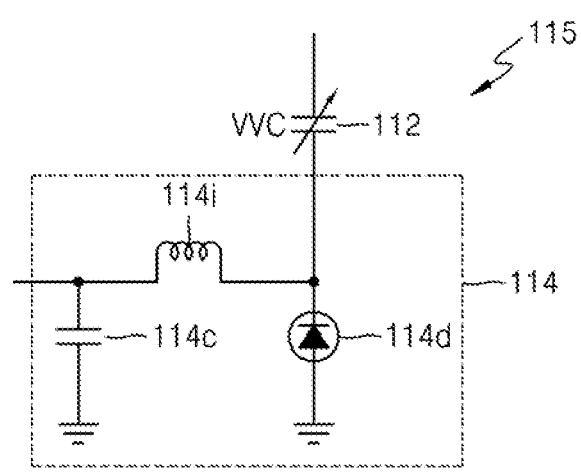
FIG. 6 is a circuit diagram illustrating in detail a part of a variable element-switch set included in a matching circuit in the hybrid matcher of FIG. 1.

FIG. 6 is a circuit diagram illustrating in detail a part of a variable element-switch set included in a matching circuit in the hybrid matcher of FIG. 1. Description is given with reference to FIG. 1 together, and the descriptions already given with reference to FIGS. 1 to 5B are briefly given or omitted.

Referring to FIG. 6, in the hybrid matcher 100 of the present example embodiment, the variable element-switch set 115 constituting the matching circuit 110 may include the variable element 112 and the switch 114. The variable element 112 may be, e.g., a VVC. Also, the switch 114 may be implemented using a PIN diode. For example, as shown in FIG. 6, the switch 114 may include a PIN diode 114*d*, a capacitor 114*c*, and an inductor 114*i*. The switch 114 having the stated configuration may be connected in series to the variable element 112, and may electrically operate at a high speed through driving by the switch driver 124 (see FIG. 1) based on the PIN diode 114*d*. In another example embodiment, the switch 114 may be implemented using a field effect transistor (FET).

Figure 7:
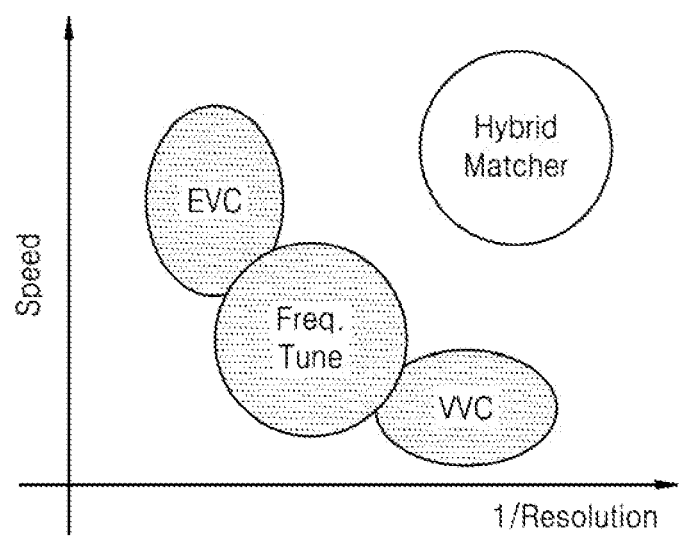
FIG. 7 is a graph illustrating an effect of the hybrid matcher of FIG. 1 in comparison with Comparative Examples.

FIG. 7 is a graph illustrating an effect of the hybrid matcher of FIG. 1 in comparison with Comparative Examples. In the graph, 'EVC' performs impedance matching using EVC, 'Freq. Tune' performs impedance matching through frequency control, 'VVC' performs impedance matching using only VVC, and 'Hybrid Matcher' performs impedance matching using the matching circuit 110 of the hybrid matcher 100 of FIG. 1.

Referring to FIG. 7, when an EVC is used, the EVC basically has a structure in which sets, in which a switch is connected to a fixed capacitor, are connected in parallel to each other, and thus impedance matching may be performed through a combination of the sets. Impedance matching by EVC may have a fast matching speed using a switch. For example, impedance matching by EVC may have a matching speed of 1 ms or less. However, because impedance varies through the fixed capacitors and combinations thereof, matching resolution may be low. For example, impedance matching by EVC may have a low matching resolution of 20 pF or more. As described above, impedance matching by EVC has a low matching resolution, and accordingly, it may be difficult to respond to a high frequency. In addition, because the EVC includes an array structure of several dozen sets, e.g., an array structure of 24 sets, the EVC occupies a large area and may be difficult to cope with high power, e.g., 3 kW or more.

In the case of the frequency adjustment method, impedance may be matched by changing a frequency of the RF generator 200. Such a frequency adjustment method may have a fast matching speed, e.g., a matching speed of 1 ms or less. However, in the case of the frequency adjustment method, impedance varies only by changing the frequency, and thus, impedance matching is incomplete. For example, impedance includes a reactance component and a resistance component, and in the case of the frequency adjustment method, high speed matching may be allowed for the reactance component but not for the resistance component. For reference, the resistance component may be significantly affected by plasma density and RF power, and accordingly, appropriate matching may be required for the resistance component.

When only VVC is used, impedance matching may have a high matching resolution, e.g., a high matching resolution of 0.1 pF or less. However, because the VVC is driven using a motor, the VVC may have a slow matching speed, e.g., a matching speed of 1 s or more. Accordingly, when only VVC is used, impedance matching may be practically impossible for RF power in a form of a multi-level pulse.

In the hybrid matcher 100 of the present example embodiment, the matching circuit 110 may have a structure in which the variable element-switch sets 115, in which the variable element 112 and the switch 114 are connected to each other in series, are connected in parallel, thereby addressing the above problems. Thus, because shifting between the states is performed through electrical switching, high-speed matching of 1 ms or less is possible, and because the variable element 112, e.g., the VVC, is used in each of the states, matching may be precisely performed with a high matching resolution of 0.1 pF or less and may easily cope with a high frequency. Because the variable element-switch sets 115 have a structure connected in parallel by as many as the number of states of the multi-level pulse, the area occupied by the variable element-switch sets 115 may be a small area and may sufficiently cope with high power, e.g., 3 kW or more.

In the graph, on the x-axis, a larger reciprocal of matching resolution may indicate a higher matching resolution. For example, it can be seen that matching resolution of 20 pF has a matching resolution lower than that of 0.1 pF. In addition, on the y-axis, a matching speed is a reciprocal of a matching time required for matching, and as the matching time decreases, the matching speed may increase. As a result, as can be seen from the graph, in the case of EVC, the matching speed is fast but the matching resolution is low, and in the case of the frequency adjustment method, both the matching speed and the matching resolution may be intermediate. In addition, when only the VVC is used, the matching speed may be low but the matching resolution may be high. In contrast, in the case of the hybrid matcher 100 of the present example embodiment, both the matching speed and the matching resolution may be high.

Figure 8:
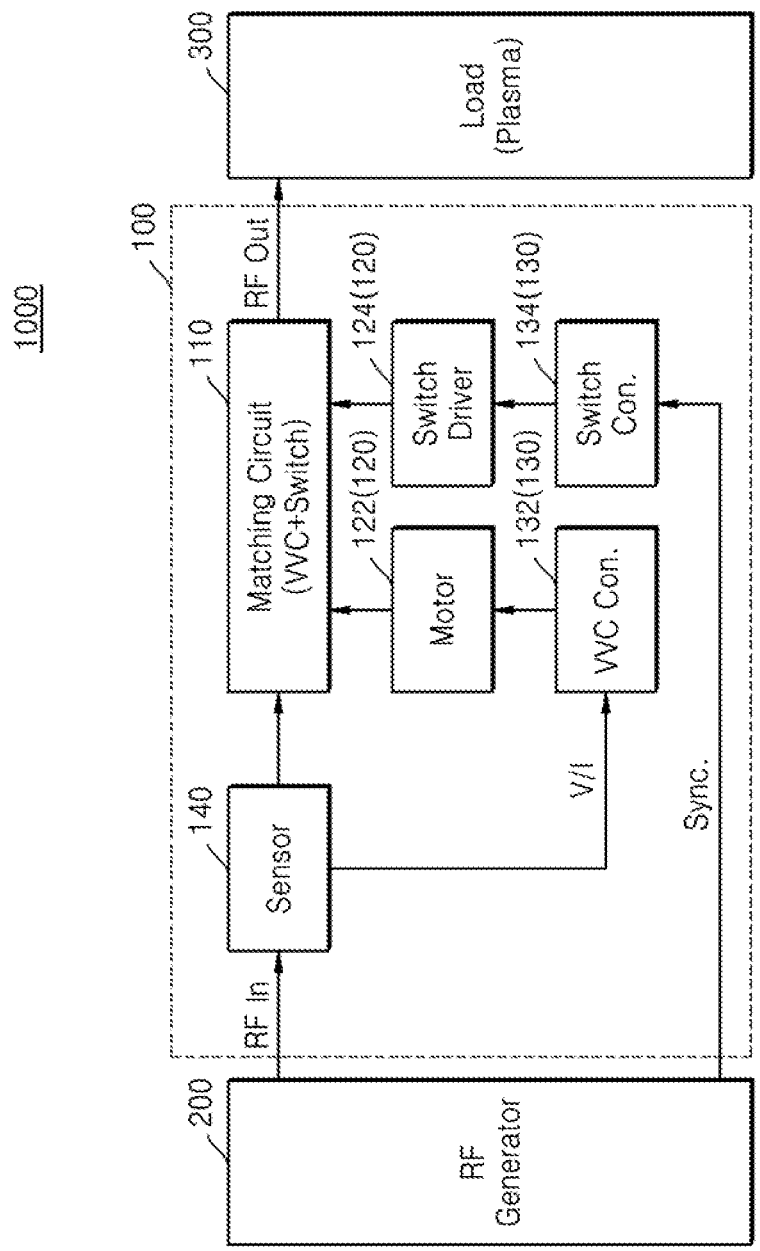
FIG. 8 is a block diagram of an RF matching system including a hybrid matcher according to an example embodiment.

FIG. 8 is a block diagram of an RF matching system 1000 including the hybrid matcher 100 according to an example embodiment. Descriptions are given with reference to FIG. 1 together, and description already given with reference to FIGS. 1 to 7 are briefly given or omitted.

Referring to FIG. 8, the RF matching system 1000 including a hybrid matcher (hereinafter, simply referred to as 'RF matching system') of the present example embodiment may include the hybrid matcher 100, the RF generator 200, and the load 300. The hybrid matcher 100 is the same as described with reference to FIG. 1.

The RF generator 200 may generate RF power, and supply the generated RF power to the load 300, e.g., a plasma chamber. The RF generator 200 may generate and output RF power of various frequencies. For example, the RF generator 200 may generate and output three types of RF power. In an example embodiment, first RF power may have a first frequency in the range of several MHz to several tens of MHz. Second RF power may have a second frequency in the range of several hundred kHz to several MHz. Third RF power may have a third frequency in the range of several tens of kHz to several hundreds of kHz. In addition, each of the three types of RF power may be power of several hundred to tens of thousands of watts (W). In the RF matching system 1000 of the present example embodiment, the RF generator 200 is not limited to three types of RF power, and may generate two or more types of RF power. In addition, the frequency range and power of each of the types of RF power are not limited to the numerical values described above.

For reference, in the plasma chamber corresponding to the load 300, the first RF power having a high frequency may generate plasma. The second RF power having a medium frequency may serve as a bias. The third RF power having a low frequency may supply energy to ions. The second RF power may perform other functions according to embodiments. For example, the second RF power may improve the function of the first RF power and/or the third RF power.

In order to improve an etch rate and an etch profile by plasma in the plasma chamber, RF power may be applied in the form of a pulse. For example, the above three types of RF power may be applied in the form of a pulse. Also, at least one of the three types of RF power may have a form of a multi-level pulse. Furthermore, total RF power, obtained by adding at least two of the three types of RF power, may also have a form of a multi-level pulse. Here, the pulse may have a frequency ranging from 100 Hz to several hundreds of Hz, or from 1 kHz to 10 kHz.

In the RF matching system 1000 of the present example embodiment, the RF generator 200 may correspond to a power supply for supplying power to the plasma chamber. Also, the plasma chamber may correspond to the load 300 receiving power from the RF generator 200. Hereinafter, a case in which the load 300 is a plasma chamber is described.

The plasma chamber may include a chamber body, an electrostatic chuck, and a shower head. The plasma chamber is a chamber for an RF plasma process, and also referred to as a plasma reactor chamber. The plasma chamber may be a capacitively coupled plasma (CCP) chamber, an inductively coupled plasma (ICP) chamber, or a combination of a CCP chamber and an ICP chamber. However, the plasma chamber is not limited to the aforementioned chambers. For example, in the RF matching system 1000 of the present example embodiment, the plasma chamber may be various types of chambers, such as an electron cyclotron resonance (ECR) plasma chamber, a surface wave plasma (SWP) chamber, a helicon wave plasma chamber, and an e-beam plasma chamber.

The chamber body may limit a reaction space in which RF plasma is formed, and seal the reaction space from the outside. The chamber body may generally include a metal material, and may maintain a ground state in order to block noise from the outside during the RF plasma process. A gas inlet, a gas outlet, a view-port, etc. may be formed in the chamber body. A process gas required for the RF plasma process may be supplied through the gas inlet. Here, the process gas may refer to all gases required in the plasma process, such as a source gas, a reaction gas, and a purge gas. After the RF plasma process through the gas outlet, gases inside the plasma chamber may be exhausted to the outside. In addition, pressure inside the plasma chamber may be adjusted through the gas outlet. One or more view-ports may be formed in the chamber body, and the inside of the plasma chamber may be monitored through the view-ports.

The electrostatic chuck may be disposed at a lower portion inside the plasma chamber, and a wafer to be subjected to an RF plasma process may be disposed and fixed on an upper surface of the electrostatic chuck. The electrostatic chuck may hold the wafer by a force of static electricity.

The shower head may be disposed at an upper portion inside the plasma chamber, and may inject process gases supplied through a gas inlet through a plurality of injection holes into the plasma chamber. The shower head may function as an electrode for transmitting RF power. Accordingly, the shower head may be connected to the hybrid matcher 100. According to an embodiment, the electrostatic chuck portion may also act as a transfer electrode to transmit RF power. Accordingly, an RF generator and a matcher connected to the electrostatic chuck portion may be disposed. For example, during the RF plasma process, the shower head may deliver RF power as a transfer electrode, and the electrostatic chuck may act as a ground. Conversely, the electrostatic chuck may deliver RF power as a transfer electrode, and the shower head may act as a ground. Also, both the electrostatic chuck and the shower head may alternately act as a transfer electrode.

By way of summation and review, in order to improve selectivity and quality, and minimize damage to a film, plasma technology, such as capacitive coupled plasma (CCP), inductive coupled plasma (ICP), or a combination of CCP and ICP, may be employed. The plasma technology may include direct plasma technology that directly generates plasma within a process chamber, which is a wafer processing space, and remote plasma technology that generates plasma outside the process chamber and supplies the generated plasma to the process chamber.

As described above, embodiments relate to a matching system, and more particularly, to a matcher for matching impedance between a radio frequency (RF) source and a load in a facility using RF plasma, and an RF matching system including the matcher.

Embodiments may provide a hybrid matcher capable of precisely performing impedance matching at a high speed when radio frequency (RF) power is applied with a multi-level pulse in a facility using RF plasma, and an RF matching system including the matcher.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A hybrid matcher, comprising:
   a first matching circuit in which a plurality of variable element-switch sets are connected to each other in parallel, the variable element-switch sets each including a variable impedance element and a switch connected to the variable impedance element in series and electrically operating therewith;
   a sensor disposed at a front stage of the first matching circuit, and configured to measure a current and a voltage of radio frequency (RF) power applied from an RF generator, the RF power including a multi-level pulse that is periodically repeated each level of the multi-level pulse corresponding to a different state of the multi-level pulse;
   a variable element driver configured to drive the variable impedance elements of the variable element-switch sets of the first matching circuit;
   a switch driver configured to drive the switches of the variable element-switch sets of the first matching circuit; and
   a controller configured to control the variable element driver and the switch driver,
   wherein first and second variable element-switch sets of the first matching circuit are assigned to corresponding first and second states of the multi-level pulse, and
   wherein, in response to the first or the second state of the multi-level pulse, the switch driver turns on the switch of the corresponding first or second variable element-switch set of the first matching circuit assigned to the corresponding state.

2. The hybrid matcher as claimed in claim 1, wherein:
   the RF power is applied to a load through the hybrid matcher, and
   the number of the variable element-switch sets of the first matching circuit equals the number of states of the multi-level pulse.

3. The hybrid matcher as claimed in claim 2, further comprising a second matching circuit in which a second plurality of variable element-switch sets are connected to each other in parallel, the variable element-switch sets each including a variable impedance element and a switch connected to the variable impedance element in series and electrically operating therewith, wherein:
   the first matching circuit is at a side corresponding to the RF generator, and the second matching circuit is at a side corresponding to the load,
   each of the first matching circuit and the second matching circuit includes the variable element-switch sets corresponding to the states of the multi-level pulse, and
   in response to a state of the multi-level pulse, a corresponding one of the variable element-switch sets of the first matching circuit and a corresponding one of the variable element-switch sets of the second matching circuit perform matching.

4. The hybrid matcher as claimed in claim 2, wherein:
   the first matching circuit has an input terminal at a side corresponding to the RF generator, an output terminal at a side corresponding to the load, and a ground terminal disposed between the input terminal and the output terminal, and
   the first matching circuit includes:
   an L-shaped structure including a third matching circuit disposed between the input terminal and the output terminal, and a fourth matching circuit disposed between the ground terminal and the input terminal or the output terminal;
   a T-shaped structure including a fifth matching circuit disposed between the input terminal or the output terminal and a connection point, a sixth matching circuit disposed between the ground terminal and the connection point, and an inductor or a fixed capacitor disposed between the output terminal or the input terminal and the connection point; or a Π-shaped structure including a seventh matching circuit disposed between the input terminal and the ground terminal, an eighth matching circuit disposed between the output terminal and the ground terminal, and a second inductor or a second fixed capacitor disposed between the input terminal and the output terminal.

5. The hybrid matcher as claimed in claim 2, wherein:
the switch driver turns on the switch of the corresponding first or second variable element-switch set and turns off other switches, and
the variable element driver adjusts impedance of a variable impedance element of the corresponding first or second variable element-switch set and connected to the switch that is turned on.

6. The hybrid matcher as claimed in claim 2, wherein:
the RF power has at least one RF frequency that is applied, and
when the RF power has a plurality of RF frequencies applied, RF power of respective sections of the plurality of RF frequencies are added up to distinguish between the states.

7. The hybrid matcher as claimed in claim 1, wherein:
the variable impedance element of each variable element-switch set includes a vacuum variable capacitor (VVC),
the variable element driver includes a motor, and
the controller includes a VVC controller configured to control the motor, and a switch controller configured to control the switch driver.

8. The hybrid matcher as claimed in claim 7, wherein:
the VVC controller controls the motor upon receiving a signal for information of the RF power from the sensor, and
the switch controller controls the switch driver upon receiving a synchronization signal from the RF generator.

9. The hybrid matcher as claimed in claim 1, wherein:
the variable impedance element of each variable element-switch set includes a vacuum variable capacitor (VVC),
the variable element driver includes a motor, and
the switch of each variable element-switch set includes a PIN diode or a field effect transistor.

10. The hybrid matcher as claimed in claim 1, wherein the hybrid matcher has a matching speed of 1 ms or less and a matching resolution of 0.1 pF or less, and performs matching on RF power of 40 MHz or higher and 3 kW or greater.

11. A hybrid matcher, comprising:
a first matching circuit in which a plurality of vacuum variable capacitor (VVC)-switch sets are connected in parallel, the VVC-switch sets each including a VVC and a switch connected to the VVC in series and electrically operating therewith;
a sensor disposed at a front stage of the first matching circuit, and configured to measure a current and a voltage of radio frequency (RF) power applied from an RF generator;
a motor configured to drive the VVCs of the VVC-switch sets of the first matching circuit;
a switch driver configured to drive the switches of the VVC-switch sets of the first matching circuit; and
a controller configured to control the motor and the switch driver,
wherein the hybrid matcher is disposed between the RF generator and a load, and performs impedance matching when the RF generator applies the RF power as a multi-level pulse to the load that is periodically repeated, each level of the multi-level pulse corresponding to a different state of the multi-level pulse,
wherein first and second variable element-switch sets of the first matching circuit are assigned to corresponding first and second states of the multi-level pulse, and
wherein, in response to the first or the second state of the multi-level pulse, the switch driver turns on the switch of the corresponding first or second variable element-switch set of the first matching circuit assigned to the corresponding state.

12. The hybrid matcher as claimed in claim 11, further comprising a second matching circuit in which a second plurality of VVC-switch sets are connected in parallel, the VVC-switch sets each including a VVC and a switch connected to the VVC in series and electrically operating therewith, wherein:
the first matching circuit is at a side corresponding to the RF generator, and the second matching circuit is at a side corresponding to the load,
each of the first matching circuit and the second matching circuit includes the VVC-switch sets connected in parallel corresponding to the states of the multi-level pulse, and
one of the VVC-switch sets of the first matching circuit and one of the VVC-switch sets of the second matching circuit perform matching in response to any one of the states of the multi-level pulse.

13. The hybrid matcher as claimed in claim 11, wherein:
the first matching circuit has an input terminal at a side corresponding to the RF generator, an output terminal at a side corresponding to the load, and a ground terminal disposed between the input terminal and the output terminal, and
the first matching circuit includes:
an L-shaped structure including a third matching circuit disposed between the input terminal and the output terminal, and a fourth matching circuit disposed between the ground terminal and the input terminal or the output terminal;
a T-shaped structure including a fifth matching circuit disposed between the input terminal or the output terminal and a connection point, a sixth matching circuit disposed between the ground terminal and the connection point, and an inductor or a fixed capacitor disposed between the output terminal or the input terminal and the connection point; or
a Π-shaped structure including a seventh matching circuit disposed between the input terminal and the ground terminal, an eighth matching circuit disposed between the output terminal and the ground terminal, and an second inductor or a second fixed capacitor disposed between the input terminal and the output terminal.

14. The hybrid matcher as claimed in claim 11, wherein:
the controller includes a VVC controller configured to control the motor, and a switch controller configured to control the switch driver,
the VVC controller controls the motor upon receiving a signal for information of the RF power from the sensor, and
the switch controller controls the switch driver upon receiving a synchronization signal from the RF generator.

15. The hybrid matcher as claimed in claim 11, wherein the switch of each variable element-switch set includes a PIN diode or a field effect transistor.

16. A radio frequency (RF) matching system, comprising:
a load;
an RF generator configured to generate RF power with a multi-level pulse that is periodically repeated, and supply the generated RF power to the load, wherein each level of the multi-level pulse corresponds to a different state of the multi-level pulse; and
a hybrid matcher disposed between the RF generator and the load, and configured to perform impedance matching, the hybrid matcher including:
  a first matching circuit in which a plurality of vacuum variable capacitor (VVC)-switch sets are connected in parallel, the VVC-switch sets each including a VVC and a switch connected to the VVC in series and electrically operating therewith;
  a sensor disposed at a front stage of the first matching circuit, and configured to measure a current and a voltage of radio frequency (RF) power applied from an RF generator;
  a motor configured to drive the VVCs of the VVC-switch sets of the first matching circuit;
  a switch driver configured to drive the switches of the VVC switch sets of the first matching circuit; and
  a controller configured to control the motor and the switch driver,
  wherein first and second variable element-switch sets of the first matching circuit are assigned to corresponding first and second states of the multi-level pulse, and
  wherein, in response to the first or the second state of the multi-level pulse, the switch driver turns on the switch of the corresponding first or second variable element-switch set of the first matching circuit assigned to the corresponding state.

17. The RF matching system as claimed in claim 16, further comprising a second matching circuit in which a second plurality of VVC-switch sets are connected in parallel, the VVC-switch sets each including a VVC and a switch connected to the VVC in series and electrically operating therewith, wherein:
  the first matching circuit is at a side corresponding to the RF generator, and the second matching circuit is at a side corresponding to the load,
  each of the first matching circuit and the second matching circuit includes the VVC-switch sets connected in parallel corresponding to the states of the multi-level pulse, and
  one of the VVC-switch sets of the first matching circuit and one of the VVC-switch sets of the second matching circuit perform matching in response to any one of the states of the multi-level pulse.

18. The RF matching system as claimed in claim 16, wherein:
  the first matching circuit has an input terminal at a side corresponding to the RF generator, an output terminal at a side corresponding to the load, and a ground terminal disposed between the input terminal and the output terminal, and
  the first matching circuit includes:
    an L-shaped structure including a third matching circuit disposed between the input terminal and the output terminal, and a fourth matching circuit disposed between the ground terminal and the input terminal or the output terminal;
    a T-shaped structure including a fifth matching circuit disposed between the input terminal or the output terminal and a connection point, a sixth matching circuit disposed between the ground terminal and the connection point, and an inductor or a fixed capacitor disposed between the output terminal or the input terminal and the connection point; or
    a Π-shaped structure including a seventh matching circuit disposed between the input terminal and the ground terminal, an eighth matching circuit disposed between the output terminal and the ground terminal, and an second inductor or a second fixed capacitor disposed between the input terminal and the output terminal.

19. The RF matching system as claimed in claim 16, wherein:
  the controller includes a VVC controller configured to control the motor, and a switch controller configured to control the switch driver,
  the VVC controller controls the motor upon receiving a signal for information of the RF power from the sensor, and
  the switch controller controls the switch driver upon receiving a synchronization signal from the RF generator.

20. The RF matching system as claimed in claim 16, wherein:
  the switch of each variable element-switch set includes a PIN diode or a field effect transistor, and
  the hybrid matcher has a matching speed of 1 ms or less and a matching resolution of 0.1 pF or less, and performs matching on RF power of 40 MHz or higher and 3 kW or greater.

* * * * *